United States Patent
Karasawa et al.

(10) Patent No.: US 8,716,401 B2
(45) Date of Patent: May 6, 2014

(54) SEMICONDUCTOR CHIP LAMINATE AND ADHESIVE COMPOSITION FOR SEMICONDUCTOR CHIP LAMINATION

(75) Inventors: Yasunori Karasawa, Tokyo (JP); Isao Ichikawa, Tokyo (JP)

(73) Assignee: Lintec Corporation (JP)

( * ) Notice: Subject to any disclaimer, the term of this patent is extended or adjusted under 35 U.S.C. 154(b) by 388 days.

(21) Appl. No.: 12/625,862

(22) Filed: Nov. 25, 2009

(65) Prior Publication Data

US 2010/0133703 A1 Jun. 3, 2010

(30) Foreign Application Priority Data

Nov. 28, 2008 (JP) .................. 2008-303743

(51) Int. Cl.
*C08L 63/00* (2006.01)
*C08L 63/02* (2006.01)
*C08L 63/04* (2006.01)
*H05K 1/02* (2006.01)

(52) U.S. Cl.
USPC ........... 525/109; 174/259; 525/113; 525/114; 525/117; 525/118; 525/119

(58) Field of Classification Search
None
See application file for complete search history.

(56) References Cited

U.S. PATENT DOCUMENTS

| | | | |
|---|---|---|---|
| 4,268,614 A * | 5/1981 | Ueyama et al. ............... | 430/315 |
| 5,110,388 A | 5/1992 | Komiyama et al. | |
| 5,118,567 A | 6/1992 | Komiyama et al. | |
| 5,356,949 A | 10/1994 | Komiyama et al. | |
| 6,277,481 B1 | 8/2001 | Sugino et al. | |
| 2006/0226520 A1 | 10/2006 | Yoshimura et al. | |
| 2007/0276079 A1 | 11/2007 | Saiki et al. | |
| 2008/0242058 A1 | 10/2008 | Ichikawa et al. | |
| 2010/0062566 A1 | 3/2010 | Yoshimura et al. | |
| 2010/0148379 A1 * | 6/2010 | Noro et al. ................... | 257/793 |

FOREIGN PATENT DOCUMENTS

| | | |
|---|---|---|
| CN | 101275062 A | 10/2008 |
| EP | 0359373 A2 | 3/1990 |
| EP | 0971011 A2 | 1/2000 |
| JP | 2032181 A | 2/1990 |
| JP | 6244360 A | 9/1994 |
| JP | 7038053 A | 2/1995 |
| JP | 7273275 A | 10/1995 |
| JP | 8239636 A | 9/1996 |
| JP | 10008001 A | 1/1998 |
| JP | 2000017246 A | 1/2000 |
| JP | 2004018720 A | 1/2004 |
| JP | 2006278520 A | 10/2006 |
| KR | 20070113126 A | 11/2007 |
| KR | 20080065844 A | 7/2008 |

* cited by examiner

*Primary Examiner* — Robert Sellers
(74) *Attorney, Agent, or Firm* — The Webb Law Firm

(57) ABSTRACT

A semiconductor chip laminate comprises a plurality of semiconductor chips and an adhesive layer through which the plurality of semiconductor chips are laminated, wherein the adhesive layer is composed of an adhesive composition comprising an acrylic polymer (A); an epoxy resin (B); a thermal curing agent (C); and a certain organophosphonium compound (D) as a thermal curing accelerator, and the content of the organophosphonium compound (D) relative to 100 parts by weight in total of the epoxy resin (B) and the thermal curing agent (C) is 0.001 to 15 parts by weight.

2 Claims, 2 Drawing Sheets (a)

(b)

(a)

(b)

SEMICONDUCTOR CHIP LAMINATE AND ADHESIVE COMPOSITION FOR SEMICONDUCTOR CHIP LAMINATION

BACKGROUND OF THE INVENTION

1. Field of the Invention

The present invention relates to an adhesive composition for semiconductor chip lamination particularly suitable for "chip stacking", the adhesive composition being used in a step of bonding a substrate and a chip or bonding chips and in a step of bonding a substrate and a chip or bonding chips using semiconductor chips obtained by dicing a silicon wafer or the like and then picking up the diced silicon wafer. The present invention also relates to a semiconductor chip laminate that uses the adhesive composition for semiconductor chip lamination.

2. Description of the Related Art

Semiconductor wafers made of silicon, gallium arsenide, and the like are manufactured with a large diameter. Such a wafer is cut (diced) into small element pieces (semiconductor chips) and then transferred to a bonding step performed next. After dicing, cleaning, drying, expanding, and picking-up steps are performed while the semiconductor wafer is attached to an adhesive sheet in advance, it is transferred to a ponding step performed next.

In the bonding step, an adhesive sheet is used to bond a substrate and a chip, bond chips, or the like. To simplify the process of the picking-up step and the bonding step among the steps described above, there are proposed various adhesive sheets for dicing and die bonding that have both a wafer fixing function and a die bonding function (e.g., refer to Japanese Unexamined Patent Application Publications No. 2-32181, No. 8-239636, No. 10-8001, and No. 2000-17246).

With such adhesive sheets, "direct die bonding" is achieved and a step of applying a liquid adhesive for die bonding can be omitted.

On the other hand, there is "a laminated semiconductor device" in which semiconductor chips are three-dimensionally laminated to achieve the speed-up and downsizing of semiconductor devices.

There have been proposed a device in which a small chip is laminated on a large chip (e.g., Japanese Unexamined Patent Application Publication No. 7-38053), a device in which chips each having a step in the periphery thereof are laminated (e.g., Japanese Unexamined Patent Application Publication No. 6-244360), and a device in which two chips are bonded to each other so as to face in opposite directions, and one of the chips is directly bonded to a substrate and the other of the chips is bonded to a substrate through a bonding wire (e.g., Japanese Unexamined Patent Application Publication No. 7-273275).

For the adhesion of the laminated chips of the laminated semiconductor devices, a dicing/die bonding sheet is more widely used than a liquid die-attaching adhesive in consideration of the quality (variation in height of chip lamination and chip tilt) and productivity of semiconductor devices.

An adhesive of the dicing/die bonding sheet includes an acrylic polymer and an epoxy thermosetting resin as a component that develops an adhesive force, and often further includes a thermal curing agent and a thermal curing accelerator for the epoxy resin.

An imidazole compound is widely used as the thermal curing accelerator in terms of the temporal stability and productivity of the sheet.

SUMMARY OF THE INVENTION

There have been extremely strict demands imposed upon the characteristics of semiconductor devices, and in particular, package reliability under severe high-temperature and humidity conditions has been required. However, since the strength of chips has decreased as a result of slimming down of semiconductor chips themselves, package reliability (resistance to highly-accelerated temperature and humidity stress test (HAST)) in a severe heat and humidity environment has become insufficient. Package reliability in a high-temperature and humidity environment can be assessed by HAST.

In a leafing-edge semiconductor device, copper but not an aluminum alloy that has been previously used is used at a silicon chip circuit and a pad portion. This is because copper has a lower resistivity than an aluminum alloy and a high-density electric current can be applied.

However, because copper is used at a semiconductor chip circuit and a pad portion in the above-described severe heat and humidity environment, there is a problem in that the corrosion of a wire, a circuit, and a pad becomes apparent compared with the case where an aluminum alloy is used.

Such a problem is seen in a semiconductor chip laminate formed by connecting a wire to a semiconductor chip and bonding another semiconductor chip having the same size as the semiconductor chip to the semiconductor chip such that the wire is embedded in an adhesive. When the semiconductor chip laminate is left under high-temperature and humidity conditions, ion impurities in the adhesive seep into absorbed water. As a result, the insulation resistance of an adhesive layer is decreased and thus such a problem arises. Furthermore, the insulation between the wires embedded in the adhesive layer cannot be maintained, which causes a short circuit in the worst case.

The inventors of the present invention have found that, for example, for an adhesive composition for dicing and bonding containing an imidazole compound as a thermal curing accelerator of an epoxy resin, the imidazole compound isolates chloride ions from a chlorine compound contained in the epoxy resin as a residue when the epoxy resin is thermally cured, and the chloride ions become ionic impurities.

Thus, when a semiconductor chip laminate is manufactured using the adhesive composition, it is known that the package reliability of the semiconductor chip laminate is low if a voltage is applied in a high-temperature and humidity environment. In particular, in the case of a semiconductor chip having a circuit and a pad made of copper, which has often been seen recently, copper is corroded, for example, at a contact portion between a wire and a circuit when a voltage is applied in a high-temperature and humidity environment, which significantly decreases the insulation. On the other hand, when the amount of the imidazole compound is decreased, the hardenability of the adhesive composition is significantly decreased.

In view of the foregoing problems, an object of the present invention is to provide a semiconductor chip laminate that can exhibit good package reliability (HAST resistance) even under high-temperature and humidity conditions, and an adhesive composition for semiconductor chip lamination that can impart such characteristics to the semiconductor chip laminate and can exhibit high efficiency of a thermal curing reaction when being thermally cured.

The inventors of the present invention studied eagerly to solve such problems. Consequently, they found that the above-described object can be achieved by using an adhesive composition containing a certain thermal curing accelerator and completed the present invention.

The summary of the present invention is as follows.

[1] A semiconductor chip laminate comprising:
   a plurality of semiconductor chips; and an adhesive layer through which the plurality of semiconductor chips are laminated, wherein the adhesive layer is composed of an adhesive composition comprising an acrylic polymer (A); an epoxy resin (B); a thermal curing agent (C); and an organophosphonium compound (D) represented by Formula (I) below as a thermal curing accelerator, and the content of the organophosphonium compound (D) relative to 100 parts by weight in total of the epoxy resin (B) and the thermal curing agent (C) is 0.001 to 15 parts by weight:

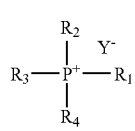

(I)

wherein $R_1$ to $R_4$ are functional groups independently selected from the group consisting of alkyl groups having 1 to 18 carbon atoms, aryl groups having 6 to 15 carbon atoms, and arylalkyl groups having 7 to 16 carbon atoms; and $Y^-$ represents an organic anion.

[2] The semiconductor chip laminate according to [1], wherein $Y^-$ in Formula (I) that represents the organophosphonium compound (D) is an organic borate anion or a carboxylic acid ion.

[3] A laminated semiconductor device comprising:
  a substrate; and
  the semiconductor chip laminate according to [1] or [2] fixed on the substrate.

[4] The laminated semiconductor device according to claim 3, wherein the plurality of semiconductor chips have the same planar shape.

[5] The laminated semiconductor device according to [3], wherein a plane area of the plurality of semiconductor chips is decreased as a distance from the substrate is increased.

[6] The laminated semiconductor device according to any one of [3] to [5], wherein a circuit surface of the plurality of semiconductor chips is not covered with a passivation coating.

[7] An adhesive composition for semiconductor chip lamination comprising:
  an acrylic polymer (A);
  an epoxy resin (B);
  a thermal curing agent (C); and
  an organophosphonium compound (D) represented by Formula (I) below as a thermal curing accelerator,
  wherein the content of the organophosphonium compound (D) relative to 100 parts by weight in total of the epoxy resin (B) and the thermal curing agent (C) is 0.001 to 15 parts by weight:

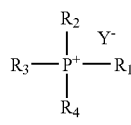

(I)

wherein $R_1$ to $R_4$ are functional groups independently selected from the group consisting of alkyl groups having 1 to 18 carbon atoms, aryl groups having 6 to 15 carbon atoms, and arylalkyl groups having 7 to 16 carbon atoms; and $Y^-$ represents an organic anion.

[8] The adhesive composition for semiconductor chip lamination according to [7], wherein $Y^-$ in Formula (I) that represents the organophosphonium compound (D) is an organic borate anion or a carboxylic acid ion.

[9] An adhesive sheet for semiconductor chip lamination comprising a base material film and an adhesive layer thereon, wherein the adhesive layer is composed of the adhesive composition for semiconductor chip lamination according to [7] or [8]

The semiconductor chip laminate of the present invention can exhibit good package reliability (HAST resistance) even under high-temperature and humidity conditions because a cured adhesive composition constituting an adhesive layer contains only a small amount of ion impurities. The adhesive composition for semiconductor chip lamination of the present invention can impart such characteristics to the semiconductor chip laminate. Furthermore, the adhesive composition used for the semiconductor chip laminate of the present invention can exhibit high efficiency of a thermal curing reaction when being thermally cured because it contains an organophosphonium compound as a thermal curing accelerator.

DESCRIPTION OF THE PREFERRED EMBODIMENTS

Figure 1:
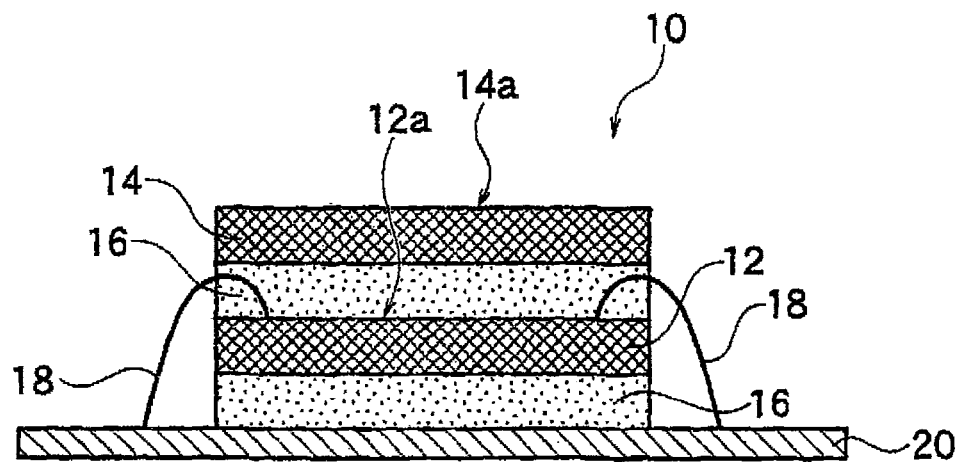
FIG. 1(a) is a sectional view schematically showing a laminated semiconductor device of the present invention.
FIG. 1(b) is a top view of the laminated semiconductor device of the present invention (this figure is partially notched to schematically show the lamination of semiconductor chips of the laminated semiconductor device)
Figure 1:
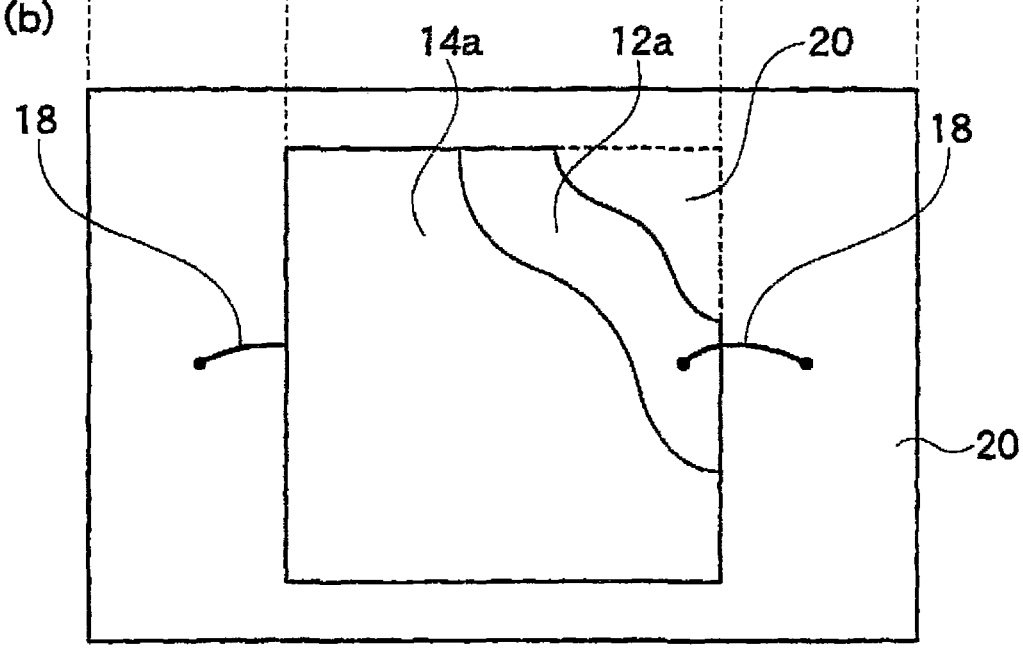

A semiconductor chip laminate according to the present invention is a semiconductor chip laminate including a plurality of semiconductor chips and an adhesive layer through which the plurality of semiconductor chips are laminated, wherein the adhesive layer is composed of an adhesive composition of the present invention essentially including an acrylic polymer (A); an epoxy resin (B); a thermal curing agent (C); and a certain organophosphonium compound (D) as a thermal curing accelerator, and the content of the organophosphonium compound (D) relative to 100 parts by weight in total of the epoxy resin (B) and the thermal curing agent (C) is 0.001 to 15 parts by weight.

To improve the physical properties of the semiconductor chip laminate or the adhesive composition, the adhesive composition may optionally include other components. The present invention will be specifically described hereinafter.

The acrylic polymer (A), the epoxy resin (B), the thermal curing agent (C), and the certain organophosphonium compound (D) may be called an A component, a B component, a C component, and a D component, respectively.

1. Adhesive Composition

Acrylic Polymer (A)

Known acrylic polymers can be used as the acrylic polymer (A).

The weight-average molecular weight of the acrylic polymer (A) is preferably 10,000 or more and 2,000,000 or less, more preferably 100,000 or more and 1,500,000 or less. When the weight-average molecular weight of the acrylic polymer (A) is less than 10,000, the adhesive force to a base material increases, which may cause pick-up failure. When the weight-average molecular weight is more than 2,000,000, an adhesive layer sometimes cannot follow the rugged surface of a substrate, which may cause voids or the like.

The glass transition temperature of the acrylic polymer (A) is preferably −60 to 50° C., more preferably −50 to 40° C., more preferably −40 to 30° C. When the glass transition temperature is less than −60° C., the peel force between an adhesive layer and a base material increases, which may cause pick-up failure. When the glass transition temperature is more than 10° C., in particular 50° C., an adhesive force for fixing a wafer may become insufficient.

A (meth)acrylate monomer or the derivatives thereof are exemplified as a monomer of the acrylic polymer (A). Examples of the monomer of the acrylic polymer (A) include alkyl (meth)acrylates whose alkyl group has 1 to 18 carbon atoms such as methyl (meth)acrylate, ethyl (meth)acrylate, propyl (meth)acrylate, and butyl (meth)acrylate; (meth)acrylates having a cyclic backbone such as cycloalkyl (meth) acrylate, benzyl (meth)acrylate, isobornyl acrylate, dicyclopentanyl acrylate, dicyclopentenyl acrylate, dicyclopentenyloxyethyl acrylate, and imide acrylate; and hydroxymethyl (meth)acrylate, 2-hydroxyethyl (meth)acrylate, 2-hydroxypropyl (meth)acrylate, and glycidyl (meth) acrylate. Acrylic acid, methacrylic acid, itaconic acid, vinyl acetate, acrylonitrile, styrene, and the like may be copolymerized. In addition, monomers having a hydroxyl group are preferred in consideration of the compatibility with an epoxy resin.

Epoxy Resin (B)

Various known epoxy resins can be used as the epoxy resin (B). Epoxy resins having two or more functional groups in a structural unit such as a bisphenol A epoxy resin, a bisphenol F epoxy resin, a cresol novolac epoxy resin, a dicyclopentadiene epoxy resin, and a biphenyl epoxy resin and the hydrogenated products thereof are exemplified as the epoxy resin.

In the adhesive composition of the present invention, the content of the epoxy resin (B) relative to 100 parts by weight of the acrylic polymer (A) is preferably 1 to 1500 parts by weight, more preferably 3 to 1000 parts by weight. When the content is less than 1 part by weight, sufficient adhesiveness sometimes cannot be achieved. When the content is more than 1500 parts by weight, the peel force between a base material and an adhesive layer increases, which may cause pick-up failure, or the film formability of an adhesive layer is degraded.

Thermal Curing Agent (C)

The thermal curing agent (C) functions as a curing agent for the epoxy resin (B). The thermal curing agent (C) is preferably a compound having two or more functional groups that react with an epoxy group in one molecule. Examples of the functional groups include a phenolic hydroxyl group, an alcoholic hydroxyl group, an amino group, a carboxyl group, and an acid anhydride. Preferably, a phenolic hydroxyl group, an amino group, and an acid anhydride are exemplified. More preferably, a phenolic hydroxyl group and an amino group are exemplified.

Examples of the thermal curing agent include phenol thermal curing agents such as a novolac phenol resin, a dicyclopentadiene phenol resin, a multifunctional phenol resin, and an aralkylphenol resin; and amine thermal curing agents such as dicyandiamide (DICY). These thermal curing agents may be used alone or in combination.

The amount of the thermal curing agent (C) used relative to 100 parts by weight of the epoxy resin (B) is preferably 0.1 to 500 parts by weight, more preferably 1 to 200 parts by weight.

When the amount of the thermal curing agent (C) is less than 0.1 parts by weight, adhesiveness is sometimes not achieved due to lack of curing. When the amount is more than 500 parts by weight, moisture absorptivity increases and may decrease package reliability.

In the adhesive composition of the present invention, the content of the (C) component relative to 100 parts by weight of the (A) component is preferably 1 to 1500 parts by weight, more preferably 3 to 1000 parts by weight. When the content of the (C) component relative to 100 parts by weight of the (A) component is less than 1 part by weight, sufficient adhesiveness is sometimes not achieved between a semiconductor chip and an adhesive layer composed of the adhesive composition. When the content is more than 1500 parts by weight, the thermal curing agent bleeds out, which becomes a cause of impurities.

Organophosphonium Compound (D)

The organophosphonium compound (D) is used as a thermal curing accelerator to accelerate a thermal curing reaction between the epoxy resin (B) and the thermal curing agent (C), and is an organophosphonium compound represented by Formula (I) below:

wherein, $R_1$ to $R_4$ are functional groups independently selected from the group consisting of alkyl groups having 1 to 18 carbon atoms, aryl groups having 6 to 15 carbon atoms, and arylalkyl groups having 7 to 16 carbon atoms; and $Y^-$ represents an organic anion. The organic anion is preferably an organic borate anion or a carboxylic acid ion.

Examples of the organic borate anion include tetraphenylborate, tetramethylphenylborate, tetraparafluorophenylborate, tetramethoxyphenylborate, and tetrametafluorophenylborate. In particular, tetraphenylborate and tetramethylphenylborate are preferred.

Examples of the carboxylic acid ion include a decanoate ion and an acetate ion. In particular, a decanoate ion is preferred.

Examples of the organophosphonium compound (D) represented by Formula (I) above include tetraphenlyphosphonium-tetraphenylborate, tetraphenlyphosphonium-tetramethylphenylborate, tetrabutylphosphonium decanoate, tetraphenylphosphonium thiocyanate, tetramethylphosphonium tetrafluoroborate, tetraethylphosphonium tetrafluoroborate, tetra-n-propylphosphonium tetrafluoroborate, tetra-iso-propylphosphonium tetrafluoroborate, tetra-n-butylphosphonium tetrafluoroborate, tetra-iso-butylphosphonium tetrafluoroborate, tetra-s-butylphosphonium tetrafluoroborate, tetra-t-butylphosphonium tetrafluoroborate, tetra-n-pentylphosphonium tetrafluoroborate, tetra-iso-pentylphosphonium tetrafluoroborate, tetra-t-pentylphosphonium tetrafluoroborate, tetraneopentylphosphonium tetrafluoroborate, trimethylethylphosphonium tetrafluoroborate, trimethyl-n-propylphosphonium tetrafluoroborate, trimethyl-iso-propylphosphonium tetrafluoroborate, trimethyl-n-butylphosphonium tetrafluoroborate, trimethyl-iso-butylphosphonium tetrafluoroborate, trimethyl-t-butylphosphonium tetrafluoroborate, trimethyl-s-butylphosphonium tetrafluoroborate, trimethyl-n-pentylphosphonium tetrafluoroborate, trimethyl-t-pentylphosphonium tetrafluoroborate, trimethylneopentylphosphonium tetrafluoroborate, triethylmethylphosphonium tetrafluoroborate, triethyl-n-propylphosphonium tetrafluoroborate, triethyl-iso-propylphosphonium tetrafluoroborate, triethyl-n-butylphosphonium tetrafluoroborate, triethyl-iso-butylphosphonium tetrafluoroborate, triethyl-t-butylphosphonium tetrafluoroborate, triethyl-butylphosphonium tetrafluoroborate, triethyl-n-pentylphosphonium tetrafluoroborate, triethyl-t-pentylphosphonium tetrafluoroborate, triethylneopentylphosphonium tetrafluoroborate, tri-n-butylmethylphosphonium tetrafluoroborate, tri-n-butyl-n-propylphosphonium tetrafluoroborate, tri-n-butyl-iso-propylphosphonium tetrafluoroborate, tri-n-butyl-iso-butylphosphonium tetrafluoroborate, tri-n-butyl-t-butylphosphonium tetrafluoroborate, tri-n-butyl-s-butylphosphonium tetrafluoroborate, tri-n-butyl-n-pentylphosphonium tetrafluoroborate, tri-n-butyl-t-pentylphosphonium tetrafluoroborate, tri-n-butylneopentylphosphonium tetrafluoroborate, tri-n-pentylmethylphosphonium tetrafluoroborate, tri-n-pentylethylphosphonium tetrafluoroborate, and tri-n-pentyl-n-butylphosphonium tetrafluoroborate. They are used alone or in combination. Since high adhesiveness can be imparted to the adhesive composition by improving a thermal curing reaction rate, the organophosphonium compound (D) is preferably tetraphenlyphosphonium-tetraphenylborate, tetraphenlyphosphonium-tetramethylphenylborate, tetrabutylphosphonium decanoate, or tetraphenylphosphonium thiocyanate.

In the adhesive composition of the present invention, the content of the organophosphonium compound (D) relative to 100 parts by weight in total of the (B) component and the thermal curing agent (C) is 0.001 to 15 parts by weight, preferably 0.005 to 10 parts by weight, more preferably 0.01 to 8 parts by weight. When the content of the organophosphonium compound (D) is within the above-described range, the adhesive composition can exhibit high efficiency of a thermal curing reaction and high storage stability. When the content of the (D) component in the adhesive composition relative to 100 parts by weight in total of the (B) component and the (C) component is less than 0.001 parts by weight, the thermal curing reaction rate of the adhesive composition is decreased. When the content is more than 15 parts by weight, the storage stability of the adhesive composition may be decreased.

Energy-Beam-Polymerizable Compound (E)

The adhesive force of an adhesive layer can be reduced and the delamination between a base material and an adhesive layer can be easily performed by curing the adhesive composition through the irradiation of energy beams. Thus, the adhesive composition of the present invention preferably includes an energy-beam-polymerizable compound (E).

The energy-beam-polymerizable compound (E) is polymerized and cured through the irradiation of energy beams such as ultraviolet rays or electron beams. Examples of the energy-beam-polymerizable compound (E) include acrylate compounds such as dicyclopentadienedimethoxy diacrylate, trimethylolpropane triacrylate, pentaerythritol triacrylate, pentaerythritol tetraacrylate, dipentaerythritol monohydroxy pentaacrylate, dipentaerythritol hexaacrylate or 1,4-butylene glycol diacrylate, 1,6-hexanediol diacrylate, polyethylene glycol diacrylate, oligoester acrylate, urethane acrylate oligomers, epoxy-modified acrylate, polyether acrylate, and itaconic acid oligomers.

Such compounds have at least one polymerizable double bond in the molecule thereof. The weight-average molecular weight of such compounds is normally 100 to 30,000, preferably about 300 to 10,000.

When the energy-beam-polymerizable compound (E) is used, the amount of the energy-beam-polymerizable compound (E) used relative to 100 parts by weight of the acrylic polymer (A) is normally 1 to 400 parts by weight, preferably 3 to 200 parts by weight, more preferably 10 to 100 parts by weight. When the amount is more than 400 parts by weight, the adhesiveness of an adhesive layer to an organic substrate or a lead frame may decrease.

The adhesive composition containing such an energy-beam-polymerizable compound (E) is cured through the irradiation of energy beams. Examples of the energy beams include ultraviolet rays and electron beams.

Photopolymerization Initiator (F)

When the energy-beam-polymerizable compound (E) is used and ultraviolet rays are used as the energy beams, the adhesive composition of the present invention preferably includes a photopolymerization initiator (F) to reduce the time for polymerization and curing and the amount of the irradiation of beams.

Examples of the photopolymerization initiator (F) include benzophenone, acetophenone, benzoin, benzoin methyl ether, benzoin ethyl ether, benzoin isopropyl ether, benzoin isobutyl ether, benzoin benzoate, benzoin methyl benzoate, benzoin dimethyl ketal, 2,4-diethylthioxanthone, α-hydroxycyclohexyl phenyl ketone, benzyldiphenyl sulfide, tetramethylthiuram monosulfide, azobis-iso-butyronitrile, β-chloroanthraquinone, and 2,4,6-trimethylbenzoyl diphenylphosphine oxide. They can be used alone or in combination.

Theoretically, the blending ratio of the photopolymerization initiator (F) should be determined on the basis of the amount of unsaturated bonds that exist in an adhesive, the reactivity of the unsaturated bonds, and the reactivity of a photopolymerization initiator to be used. However, the determination is not always easy in a complex mixture. When the photopolymerization initiator (F) is used, the content of the photopolymerization initiator (F) relative to 100 parts by weight of the acrylic polymer (A) is normally 0.1 to 10 parts by weight, preferably 1 to 5 parts by weight. When the content is within the above-described range, satisfactory pick-up performance can be achieved. When the content is more than 10 parts by weight, residues that do not contribute to photopolymerization are produced and the hardenability of an adhesive may become insufficient.

Coupling Agent (G)

The adhesive composition of the present invention preferably includes a coupling agent (G) because a coupling agent improves stickiness and adhesiveness of the adhesive composition to a semiconductor chip and provides water resistance to a cured material obtained by curing the adhesive composition, without losing the thermal resistance of the cured material.

A compound having a group that reacts with a functional group included in the (A) component, the (B) component, and the like is preferably used as the coupling agent. A silane coupling agent is desired as the coupling agent.

Examples of the coupling agent include γ-glycidoxypropyltrimethoxysilane, γ-glycidoxypropylmethyldiethoxysilane, β-(3,4-epoxycyclohexyl)ethyltrimethoxysilane, γ-(methacryloxypropyl)trimethoxysilane, γ-aminopropyltrimethoxysilane, N-6-(aminoethyl)-γ-aminopropyltrimethoxysilane, N-6-(aminoethyl)-γ-aminopropylmethyldiethoxysilane, N-phenyl-γ-aminopropyltrimethoxysilane, γ-ureidepropyltriethoxysilane, γ-mercaptopropyltrimethoxysilane, γ-mercaptopropylmethyldimethoxysilane, bis(3-triethoxysilylpropyl)tetrasulfane, methyltrimethoxysilane, methyltriethoxysilane, vinyltrimethoxysilane, vinyltriacetoxysilane, and imidazole silane. They can be used alone or in combination.

When the coupling agent is used, the content of the coupling agent relative to 100 parts by weight of the epoxy resin (B) is normally 0.1 to 20 parts by weight, preferably 0.2 to 10 parts by weight, more preferably 0.3 to 5 parts by weight. When the content is less than 0.1 parts by weight, no effect may be produced. When the content is more than 20 parts by weight, outgassing may be caused.

Inorganic Filler (H)

An inorganic filler (H) may be used to adjust the coefficient of thermal expansion of the adhesive composition. By optimizing the coefficient of thermal expansion of a cured adhesive layer with reference to the coefficient of thermal expansion of a chip or a metal or organic substrate through blending the inorganic filler (H) into the adhesive composition, the reliability of a semiconductor device can be improved. In addition, the moisture absorptivity of the cured adhesive layer can be reduced.

Powders such as silica, alumina, talc, calcium carbonate, titanium white, colcothar, silicon carbide, and boron nitride; beads obtained by making the powders into spheres; monocrystalline fiber; and glass fiber are exemplified as preferable inorganic fillers. Among them, silica powder and alumina powder are preferred. They may be used alone or in combination. The content of the inorganic filler (H) relative to 100% by weight of the adhesive composition is normally 0 to 80% by weight.

Cross-Linking Agent (I)

The adhesive composition of the present invention may optionally include a cross-linking agent (I) because a cross-linking agent can control an initial adhesive force and a cohesive force of the adhesive composition.

Organic polyvalent isocyanate compounds and organic polyvalent imine compounds are exemplified as the cross-linking agent. Examples of the organic polyvalent isocyanate compounds include aromatic polyvalent isocyanate compounds, aliphatic polyvalent isocyanate compounds, alicyclic polyvalent isocyanate compounds, trimers of these polyvalent isocyanate compounds, and terminal isocyanate urethane prepolymers obtained by allowing these polyvalent isocyanate compounds to react with polyol compounds.

More specific examples of the organic polyvalent isocyanate compounds include 2,4-tolylene diisocyanate, 2,6-tolylene diisocyanate, 1,3-xylylene diisocyanate, 1,4-xylene diisocyanate, diphenylmethane-4,4'-diisocyanate, diphenylmethane-2,4'-diisocyanate, 3-methyldiphenylmethane diisocyanate, hexamethylene diisocyanate, isophorone diisocyanate, dicyclohexylmethane-4,4'-diisocyanate, dicyclohexylmethane-2,4'-diisocyanate, trimethylolpropane adduct toluoylene diisocyanate, and lysine isocyanate.

Examples of the organic polyvalent imine compounds include N,N'-diphenylmethane-4,4'-bis(1-aziridinecarboxyamide), trimethylolpropane-tri-β-aziridinyl propionate, tetramethylolmethane-tri-β-aziridinyl propionate, and N,N'-toluene-2,4-bis(1-aziridinecarboxyamide)triethylenemelamine. The content of the cross-linking agent (H) relative to 100 parts by weight of the acrylic polymer (A) is normally 0.01 to 10 parts by weight, preferably 0.1 to 5 parts by weight, more preferably 0.5 to 3 parts by weight.

Other Components

In addition to the above-described components, various additives may optionally be added to the adhesive composition of the present invention.

For example, a flexible component can be added to maintain flexibility after curing. A flexible component is a component that has flexibility at room temperature and under heating. The flexible component may be a polymer composed of a thermoplastic resin or an elastomer or may be a graft component of a polymer or a block component of a polymer. The flexible component may be modified in advance with an epoxy resin.

The adhesive composition may include an ion trapping agent because an ion trapping agent produces an effect of trapping an ion isolated from an adhesive, such as an chlorine ion that causes electrolytic corrosion at wiring or a pad of a semiconductor device. Both ion adsorption type (porous filler type) and ion exchanging type ion trapping agents may be used. Furthermore, various additives such as a plasticizer, an antistatic agent, an antioxidant, a pigment, and a dye may be optionally added to the adhesive composition according to the present invention to improve the physical properties of the adhesive composition.

Adhesive Composition

The adhesive composition including the specified components described above can exhibit high efficiency of a thermal curing reaction when being thermally cured because the adhesive composition contains an organophosphonium compound as a thermal curing accelerator. Since a small amount of ion impurities is contained in the adhesive composition, good package reliability (HAST resistance) can be imparted to a semiconductor chip laminate of the present invention even under high-temperature and humidity conditions.

In other words, the adhesive composition of the present invention can ease a problem in that ion impurities contained in an adhesive between laminated chips seep into absorbed water by leaving a laminated semiconductor device under high-temperature and humidity conditions, thereby decreasing the insulation resistance of an adhesive layer, as seen in a laminated semiconductor device that has been previously used. Furthermore, the adhesive composition can ease a problem in that a short circuit is generated when the insulation between wires embedded in an adhesive layer cannot be maintained.

Accordingly, the adhesive composition of the present invention is preferably used to bond semiconductor chips in a semiconductor chip laminate in which two or more layers of semiconductor chips are laminated.

The adhesive composition according to the present invention is obtained by mixing the above-described components in suitable proportions. In the mixing, the components may be diluted in advance with a solvent or a solvent may be added in the mixing the components.

2. Adhesive Sheet

An adhesive sheet according to the present invention comprises a base material and an adhesive layer thereon, wherein the adhesive layer is composed of the above-described adhesive composition. The adhesive sheet according to the present invention can have any shape such as a tape shape or a label shape.

The adhesive sheet may be manufactured by applying a composition constituting an adhesive layer on a base material and then drying it. Alternatively, the adhesive sheet may be manufactured by forming an adhesive layer on a release film and then transferring it to a base material. Prior to the use of the adhesive sheet, a release film may be laminated on an upper surface of an adhesive layer to protect the adhesive layer. Moreover, another adhesive layer or adhesive tape may be disposed in the periphery of the surface of the adhesive layer to fix other jigs such as a ring frame.

Examples of the base material of the adhesive sheet include films such as a polyethylene film, a polypropylene film, a polybutene film, a polybutadiene film, a polymethylpentene film, a polyvinyl chloride film, a vinyl chloride copolymer film, a polyethylene terephthalate film, a polyethylene naphthalate film, a polybutylene terephthalate film, a polyurethane film, an ethylene vinyl acetate copolymer film, an ionomer resin film, an ethylene/(meth)acrylic acid copolymer film, an ethylene/(meth)acrylate copolymer film, a polystyrene film, a polycarbonate film, a polyimide film, and a fluoroplastic film. The cross-linked films thereof may also be used. In addition, the laminated films thereof may be used. The above-described films may be transparent or opaque and may be colored or colorless.

The adhesive sheet according to the present invention is attached to various adherends, and after the adherends are subjected to required processing, an adhesive layer is detached from a base material while adheres to the adherends. That is to say, the adhesive sheet is used for a process including a step of transferring an adhesive layer from a base material to an adherend. Thus, a surface of a base material that is brought into contact with an adhesive layer preferably has a surface tension of 40 mN/m or less, more preferably 37 mN/m or less, particularly preferably 35 mN/m or less. Such a base material having a low surface tension can be obtained by suitably selecting materials or by subjecting the surface of the base material to release treatment by coating a release agent thereon.

An alkyd release agent, a silicone release agent, a fluorine release agent, an unsaturated polyester release agent, a polyolefin release agent, a wax release agent, and the like are used as the release agent for release treatment of a base material. In particular, an alkyd release agent, a silicone release agent, and a fluorine release agent are preferred because they have thermal resistance.

To subject the surface of a base material to release treatment using the above-described release agent, a release agent including no solvent or a release agent diluted in a solvent or emulsified is applied using a gravure coater, a Meyer bar coater, an air knife coater, a roll coater, or the like, and then hardened at room temperature or under heating or hardened using electron beams. Alternatively, the applied release agent is brought into a laminate by wet lamination, dry lamination, hot-melt lamination, melt-extrusion lamination, coextrusion, or the like.

The thickness of the base material is normally 10 to 500 μm, preferably 15 to 300 μm, particularly preferably about 20 to 250 μm. The thickness of the adhesive layer is normally 1 to 500 μm, preferably 5 to 300 μm, particularly preferably about 10 to 150 μm.

3. Semiconductor Chip Laminate and Laminated Semiconductor Device

A semiconductor chip laminate according to the present invention is formed by laminating a plurality of semiconductor chips through adhesive layers composed of the adhesive composition according to the present invention.

The semiconductor chip laminate can be manufactured by a method including the steps of bonding a semiconductor wafer to an adhesive layer of the adhesive sheet according to the present invention; dicing the semiconductor wafer together with the adhesive layer into semiconductor chips; detaching the adhesive layer from a base material while the adhesive layer adheres to the back side of each of the semiconductor chips; and hot-pressing the semiconductor chip on another semiconductor chip through the adhesive layer (hereinafter referred to as "a hot pressing step (a)").

The laminated semiconductor device according to the present invention includes a substrate and the semiconductor chip laminate fixed on the substrate. The laminated semiconductor device can be manufactured by a method including a step of fixing, on a substrate, a semiconductor chip laminate manufactured by a method including the above-described hot pressing step (a).

In the steps of bonding a semiconductor wafer to the adhesive sheet according to the present invention and dicing the semiconductor wafer into semiconductor chips, when the adhesive composition of the adhesive sheet includes the energy-beam-polymerizable compound (E), the adhesive layer can be irradiated withenergy beams to from the base material side to increase the cohesive force of the adhesive layer and decrease the adhesive force between the adhesive layer and the base material.

Herein, ultraviolet rays (UV), electron beams (EB), or the like are used as the energy beams for the irradiation. Preferably, ultraviolet rays are used.

The irradiation of energy beams may be performed either after the bonding of a semiconductor wafer or before the detachment of semiconductor chips. For example, the irradiation of energy beams may be performed after dicing or after the expanding step described below. Furthermore, by separating the irradiation, the irradiation of energy beams may be performed multiple times.

In the step of cutting a silicon wafer with a cutting means such as a dicing saw to obtain semiconductor chips, the cutting depth of the silicon wafer with the cutting means is preferably a depth in which the total thickness of the silicon wafer and the adhesive layer and a depth of wear of the dicing saw are taken into consideration.

By optionally expanding the adhesive sheet, the distance between semiconductor chips is increased and the semiconductor chips can be picked up more easily. In this case, the displacement between the adhesive layer and the base material decreases the adhesive force therebetween, which improves the pick-up performance of the chips.

By picking up semiconductor chips in such a manner, the cut adhesive layer can be detached from the base material while adheres to the back side of the semiconductor chip.

In manufacturing of the laminated semiconductor device according to the present invention, a semiconductor chip may be hot-pressed on another semiconductor chip (lower chip) that has been laminated on a substrate, through an adhesive layer composed of the adhesive composition of the present invention. Alternatively, after a semiconductor chip is hot-pressed on another semiconductor chip through an adhesive layer composed of the adhesive composition of the present invention to form a semiconductor chip laminate, the semiconductor chip laminate may be fixed on a substrate. Hot pressing through an adhesive layer is exemplified as a fixing means.

The lower chip may be a semiconductor chip directly laminated (or to be laminated) on a substrate through an adhesive layer or the like or may be a semiconductor chip situated in an uppermost position (in a position farthest from a substrate) of a semiconductor chip laminate including a plurality of semiconductor chips laminated (to be laminated) on a substrate.

An adhesive layer composed of the adhesive composition of the present invention may lie between a substrate and a semiconductor chip situated in a lowermost position (in a position closest to a substrate) of a semiconductor chip laminate.

In the laminated semiconductor device, a plurality of semiconductor chips may have the same planar shape as shown in FIGS. 1A and 1B. Alternatively, the plane area of the plurality of semiconductor chips may be decreased as the distance from a substrate is increased as shown in FIGS. 2A and 2B.

To further improve the package reliability under high-temperature and humidity conditions (HAST resistance), the circuit surface of the semiconductor chip may be covered with a passivation coating. Any coating that improves the corrosion resistance of the circuit surface can be used as the passivation coating. Examples of the passivation coating include metal nitride coatings such as an aluminum nitride coating and a silicon nitride coating; metal oxide coatings such as an aluminum oxide coating and a silicon oxide coating; phospho-silicate-glass (PSG) coatings; and polyimide coatings.

The passivation coating can be formed on the circuit surface of a semiconductor chip by a known method including spin coating, photolithography, chemical vapor depositions (CVDs) such as plasma CVD, thermal CVD, and photo CVD, and physical vapor depositions (PVDs) such as sputtering and vacuum deposition.

In a semiconductor chip laminate that uses a known adhesive composition, if the circuit surface of a semiconductor chip is not covered with a passivation coating, corrosion is easily caused on a surface on which an adhesive layer comes into contact with the circuit surface. To prevent the corrosion, the circuit surface needs to be covered with a passivation coating. In contrast, in a semiconductor chip laminate that uses the adhesive composition of the present invention, the corrosion on a circuit surface can be prevented without coating the circuit surface with a passivation coating. By coating the circuit surface with a passivation coating, the corrosion on the circuit surface can be further prevented.

For example, in a laminated semiconductor device 10 shown in FIG. 1, when a circuit surface 12a of a semiconductor chip 12 is covered with a passivation coating, the corrosion of a circuit is prevented at a portion where an adhesive layer 16 is in contact with the circuit surface 12a of the semiconductor chip 12.

Figure 2:
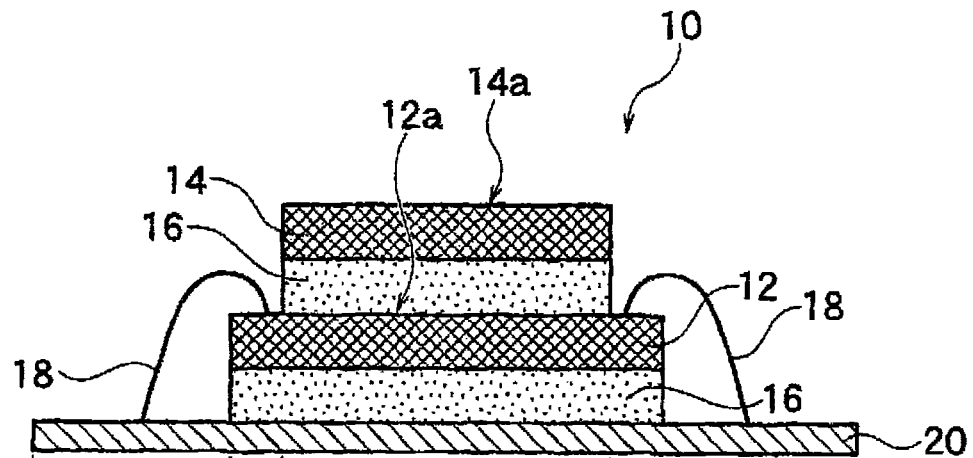
FIG. 2(a) is a sectional view schematically showing the laminated semiconductor device of the present invention.
FIG. 2(b) is a top view of the laminated semiconductor device of the present invention.
Figure 2:
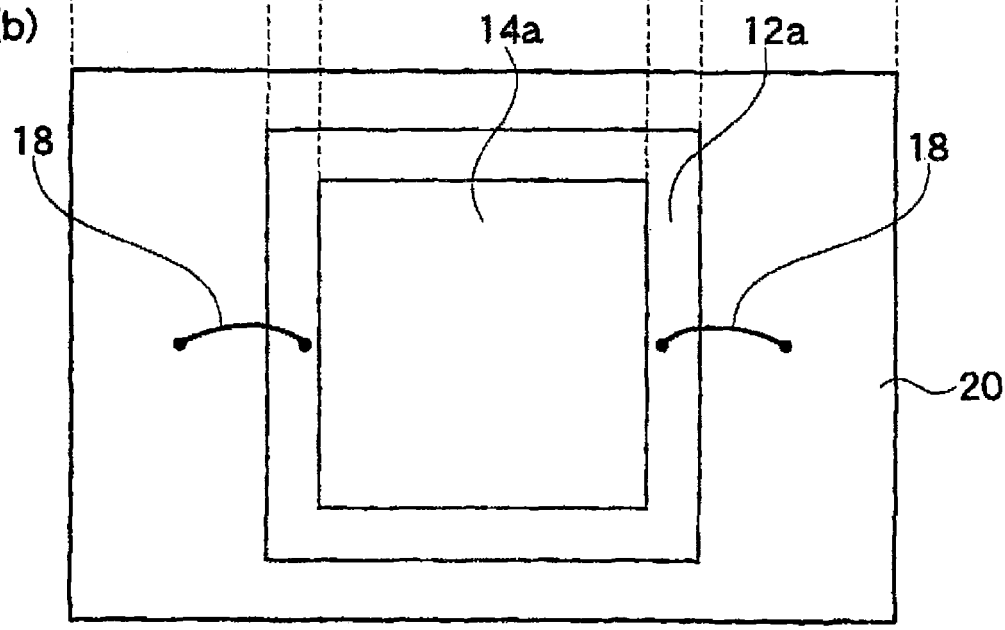

In a laminated semiconductor device 10 shown in FIG. 2, when a circuit surface 12a of a semiconductor chip 12 is covered with a passivation coating, corrosion is prevented at any portion on the circuit surface.

In the laminated semiconductor device, the circuit surface of a semiconductor chip is not necessarily covered with a passivation coating because it has sufficient corrosion resistance compared with the laminated semiconductor device of the related art even if the circuit surface of a semiconductor chip is not covered with a passivation coating and contributes to cost reduction, simplification of manufacturing steps, and the like.

The number (number of layers) of semiconductor chips laminated in a semiconductor chip laminate or a laminated semiconductor device is normally 2 to 64 layers. If necessary, a larger number of semiconductor chips, for example, 100 or more of semiconductor chips may be laminated.

Normally, the electrical conduction between a substrate and a semiconductor chip of the semiconductor chip laminate is achieved through a bonding wire. Alternatively, the semiconductor chip laminate may be fixed on a substrate and electrical conduction may be achieved through at least one electrical conduction means selected from the group consisting of a solder bump, a gold bump, and a copper bump.

When a semiconductor chip is mounted on a surface of a lower chip, the semiconductor chip may be mounted on the surface of the lower chip such that the adhesive layer of the chip to be laminated does not contact a bonding wire connected to the lower chip (refer to FIG. 2). Alternatively, the semiconductor chip may be mounted on the surface of the lower chip such that a bonding wire connected to the lower chip is embedded by adjusting the thickness of the adhesive layer or the height of the bonding wire (refer to FIG. 1). When the semiconductor chip laminate is fixed on a substrate, the semiconductor chip may be hot-pressed on another semiconductor chip (lower chip) that has been laminated on the substrate, through the adhesive layer. Alternatively, after the semiconductor chip is hot-pressed on another semiconductor chip through the adhesive layer to form a semiconductor chip laminate, the semiconductor chip laminate may be fixed on the substrate by hot pressing or the like.

Since the semiconductor chip laminate and the laminated semiconductor device according to the present invention uses an adhesive composition containing a small amount of ion impurities, the amount of ion impurities that seep into water absorbed by the adhesive composition can be decreased even under high-temperature and humidity conditions. This solves a problem of the related art in that the insulation resistance of an adhesive layer is decreased, and the insulation between electrical conduction means such as wires embedded in the adhesive layer cannot be maintained, which causes a short circuit in the worst case. Thus, good package reliability (HAST resistance) can be achieved even under high-temperature and humidity conditions.

The heating temperature at which the semiconductor chip is mounted on a substrate or on a surface of a lower chip is normally 80 to 200° C., preferably 100 to 180° C. The heating time is normally 0.1 seconds to 5 minutes, preferably 0.5 seconds to 3 minutes. The chip mounting pressure is normally 1 kPa to 200 MPa.

After the semiconductor chip is mounted on a substrate or on a surface of a lower chip, further heating may be optionally performed. The heating conditions herein are as follows. The heating temperature is within the range described above and the heating time is normally 1 to 180 minutes, preferably 10 to 120 minutes.

The chip is temporarily bonded without performing heat treatment after the chip mounting, and the adhesive layer may be cured with heating in a resin sealing step performed later. In the case where the semiconductor device comprises a plurality of adhesive layers, the adhesive layers may be thermally cured each time a single layer is disposed, after a plurality of layers are disposed, or after all layers are disposed.

Through the steps, an adhesive layer is cured and a semiconductor chip can be firmly bonded to a substrate or another semiconductor chip. Since the adhesive layer is fluidized under the die bonding conditions, it can follow even tiny rugged surface derived from a circuit pattern of the surfaces of the substrate or the lower chip, which can prevent the cause of voids.

EXAMPLES

The present invention will now be described with Examples, but is not limited to Examples.
(1) Manufacturing of Adhesive Sheet for Semiconductor Chip Lamination Each of adhesive compositions used for adhesive sheets for semiconductor chip lamination of Examples and Comparative Examples includes the following components. Table 1 shows the component ratio. In the table, numerical values are expressed as parts by weight in terms of a solid content (non-volatile component).
(A) acrylic polymer: COPONYL N-2359-6 available from The Nippon Synthetic Chemical Industry Co., Ltd. (Mw: about 300,000)

(B-1) liquid epoxy resin: bisphenol A epoxy resin (Eposet BPA328 available from NIPPON SHOKUBAI CO., LTD., epoxy equivalent 235 g/eq)
(B-2) solid epoxy resin: phenol novolac epoxy resin (EPPN502H available from Nippon Kayaku Co., Ltd., epoxy equivalent 167 g/eq)
(C) thermal curing agent: novolac phenolic resin (Shonol BRG-556 available from SHOWA HIGHPOLYMER CO., LTD., phenolic hydroxyl group equivalent 104 g/eq)
(D-1) thermal curing accelerator: tetraphenylphosphonium-tetraphenylborate (TPP-K available from HOKKO CHEMICAL INDUSTRY CO., LTD.)
(D-2) thermal curing accelerator: tetraphenylphosphonium-tetramethylphenylborate (TPP-MK available from HOKKO CHEMICAL INDUSTRY CO., LTD.)
(D-3) thermal curing accelerator: tetrabutylphosphonium decanoate (TBP-DA available from HOKKO CHEMICAL INDUSTRY CO., LTD.)
(D-4) thermal curing accelerator: tetraphenylphosphonium thiocyanate (TPP-SCN available from HOKKO CHEMICAL INDUSTRY CO., LTD.)
(D-5) thermal curing accelerator: 2-phenyl-4,5-dihydroxymethylimidazole (CUREZOL 2PHZ available from SHIKOKU CHEMICALS CORPORATION)
(E) energy-beam-polymerizable compound: active-energy-beam-curable multifunctional acrylate oligomer (LIGHT-ACRYLATE DCP-A available from Kyoeisha Chemical Co., Ltd.)
(F) photopolymerization initiator: 1-hydroxycyclohexyl phenyl ketone (IRGACURE 184 available from Ciba Specialty Chemicals Ltd.)
(G) silane coupling agent (KBM403 available from Shin-Etsu Chemical Co., Ltd.)
(H) inorganic filler (ADMAFINE SC2050 available from Admatechs Company Limited)

A polyethylene film (thickness: 100 μm, surface tension: 33 mN/m) was used as a base material of an adhesive sheet for semiconductor chip lamination.

Examples and Comparative Examples (1) Manufacturing of Adhesive Sheet for Semiconductor Chip Lamination An adhesive composition having components described in Table 1 was applied to a release film (SP-PET381031(S) available from LINTEC Corporation) subjected to silicone treatment using a die coater so as to have a thickness of 60 μm after drying, and then dried in an oven at 100° C. for 1 minute. An adhesive sheet for semiconductor chip lamination was made by attaching the release film to a base material and transferring an adhesive layer to the base material.

(2) Manufacturing of Semiconductor Chips

A positive photosensitive polyimide (PW-1200 available from Toray Industries, Inc.) was applied to the surface of a silicon wafer (diameter: 150 mm, thickness: 850 μm) by spin coating. The silicon wafer was pre-baked at 110° C. for 3 minutes using a hot plate, exposed, and developed. The silicon wafer was processed at 170° C. for 30 minutes and then at 320° C. for 60 minutes in a nitrogen atmosphere using an inert oven (INL-60 available from Koyo Thermo System Co., Ltd.) to form a passivation coating (thickness: 10 μm) composed of a polyimide coating on the surface of the silicon wafer. In Example 5 and Comparative Example 3, such a passivation coating was not formed.

Subsequently, the surface of the silicon wafer on which the passivation coating was not formed was ground with a #2000 grinding wheel such that the silicon wafer had a thickness of 150 μm. Each of adhesive sheets of Examples and Comparative Examples was attached to the ground surface using a tape mounter (Adwill RAD2500 available from LINTEC Corporation), and the silicon wafer was fixed to a ring frame for wafer dicing. The irradiation of ultraviolet rays (350 mW/cm$^2$, 190 mJ/cm$^2$) was then performed from the base material side using an ultraviolet-ray irradiation apparatus (Adwill RAD2000 available from LINTEC Corporation). The silicon wafer was then diced into 8 mm×8 mm or 6 mm×6 mm chips using a dicing machine (DFD651 available from DISCO Corporation). The cutting depth into the base material when dicing was 20 μm.

TABLE 1

|  |  | Example 1 | Example 2 | Example 3 | Example 4 | Example 5 | Comparative Example 1 | Comparative Example 2 | Comparative Example 3 |
|---|---|---|---|---|---|---|---|---|---|
| Components of adhesive resin composition | A | 100 | 100 | 100 | 100 | 100 | 100 | 100 | 100 |
|  | B-1 | 316 | 316 | 316 | 316 | 316 | 316 | 316 | 316 |
|  | B-2 | 352 | 352 | 352 | 352 | 352 | 352 | 352 | 352 |
|  | C | 320 | 320 | 320 | 320 | 320 | 320 | 320 | 320 |
|  | D-1 | 18 | — | — | — | 18 | — | — | — |
|  | D-2 | — | 68 | — | — | — | — | — | — |
|  | D-3 | — | — | 4.9 | — | — | — | — | — |
|  | D-4 | — | — | — | 18 | — | — | — | — |
|  | D-5 | — | — | — | — | — | 18 | 2.3 | 18 |
|  | E | 85 | 85 | 85 | 85 | 85 | 85 | 85 | 85 |
|  | F | 0.5 | 0.5 | 0.5 | 0.5 | 0.5 | 0.5 | 0.5 | 0.5 |
|  | G | 12 | 12 | 12 | 12 | 12 | 12 | 12 | 12 |
|  | H | 200 | 200 | 200 | 200 | 200 | 200 | 200 | 200 |
| Chip size (mm × mm) | First layer chip | 8 × 8 | 8 × 8 | 8 × 8 | 8 × 8 | 8 × 8 | 8 × 8 | 8 × 8 | 8 × 8 |
|  | Second layer chip | 8 × 8 | 8 × 8 | 8 × 8 | 8 × 8 | 6 × 6 | 8 × 8 | 8 × 8 | 6 × 6 |
| Passivation coating |  | presence (polyimide coating) | presence (polyimide coating) | presence (polyimide coating) | presence (polyimide coating) | absence | presence (polyimide coating) | presence (polyimide coating) | absence |

(3) Manufacturing of Laminated Semiconductor Device

A BT substrate (available from Chino Giken Co., Ltd.) including a circuit pattern formed on a copper foil of a copper-clad laminate (CCL-HL830 available from MITSUBISHI GAS CHEMICAL COMPANY, INC.) and a solder resist (PSR4000AUS303 available from TAIYO INK MFG. CO., LTD.) having a thickness of 40 μm on the circuit pattern was used as a substrate. The chip on the adhesive sheet obtained in (1) described above was picked up from the base material together with the adhesive layer, and press-bonded to the BT substrate through the adhesive layer at 120° C. at 100 gf for 1 second. By heating the BT substrate at 120° C. for 30 minutes and then at 140° C. for 30 minutes, the adhesive layer was sufficiently thermally cured to fix the chip.

On the chip (hereinafter referred to as "first layer chip") fixed on the substrate, a chip (hereinafter referred to as "second layer chip") with the adhesive layer having the same size as the first layer chip was press-bonded at 120° C. at 100 gf for 1 second. By heating the substrate at 120° C. for 30 minutes and then at 140° C. for 30 minutes, the adhesive layer of the second layer chip was sufficiently cured.

In Examples 1 to 4 and Comparative Examples 1 and 2, 8 mm×8 mm chips were used as the first layer chip and the second layer chip. In the manufactured laminated semiconductor chip, the first layer chip and the second layer chip have the same planar shape.

On the other hand, in Example 5 and Comparative Example 3, an 8 mm×8 mm chip was used as the first layer chip and a 6 mm×6 mm chip was used as the second layer chip. In the manufactured laminated semiconductor chip, the plane area of the semiconductor chips is decreased as the distance from the substrate is increased.

Subsequently, the BT substrate was sealed using a mold resin (KE-1100AS3 available from KYOCERA Chemical Corporation) with a sealing thickness of 700 μm (sealing apparatus: MPC-06M Trial Press available from APIC YAMADA CORPORATION). The mold resin was cured by processing it at 175° C. for 5 hours. The sealed BT substrate was then attached to a dicing tape (Adwill D-510T available from LINTEC Corporation), and diced into devices having a size of 12 mm×12 mm using a dicing machine (DFD651 available from DISCO Corporation) to obtain a laminated semiconductor device.

Evaluation (4) Reactivity Evaluation of Adhesive Composition for Semiconductor Chip Lamination An adhesive composition for semiconductor chip lamination (0.0150 g) cured using ultraviolet rays at an illuminance of 120 mW/cm² at a light intensity of 120 mJ/cm² but not thermally cured was subjected to differential scanning calorimetry (DSC) under the following conditions to measure a heat value (integral value) derived from the heat of curing of an epoxy resin. The measured heat value was expressed as $\Delta H_0$ (kJ).
Differential scanning calorimetry (DSC)
Unit: Pyris-I available from PerkinElmer, Inc.
Temperature increasing rate: 10° C./min
Temperature range: 50 to 300° C.

An adhesive composition for semiconductor chip lamination (0.0150 g) cured using ultraviolet rays under the same conditions as those described above and thermally cured at 120° C. for 30 minutes and then at 140° C. for 30 minutes was subjected to DSC using the same conditions as those described above to measure a heat value (integral value) derived from the heat of curing of an epoxy resin. The measured heat value was expressed as $\Delta H_1$ (kJ).

The reaction rate (%), which shows the percentage of an epoxy resin that has reacted, was calculated on the basis of the following formula using the measured $\Delta H_0$ (kJ) and $\Delta H_1$ (kJ). Table 2 shows the results.

Reaction rate=$(\Delta H_0 - \Delta H_1)/\Delta H_0 \times 100$

When the reaction rate is 100%, there is no unreacted epoxy resin in the adhesive composition and all the epoxy resin in the adhesive composition has been thermally cured.

(5) Measurement of Ion Impurities

Adhesive layers used in the adhesive sheet for semiconductor chip lamination were laminated at room temperature until the total thickness reached 200 μm. The obtained laminate was irradiated with ultraviolet rays to from one side at an illuminance of 120 mW/cm² at a light intensity of 120 mJ/cm² and then from the other side under the same conditions.

Subsequently, the laminate was heated at 120° C. for 30 minutes and then at 140° C. for 30 minutes in an oven to obtain an adhesive cured material. The obtained adhesive cured material was pulverized using a vibration mill (TI-100 available from Heiko Seisakusho). The pulverized adhesive cured material was put through a 100 mesh wire net made of stainless steel, and 1 g of the adhesive cured material that passed through the wire net was mixed with 20 ml of pure water in a vessel for ion concentration measurement made of Teflon (registered trademark). The mixture was heated at 121° C. for 24 hours to prepare an extraction liquid. The ion concentration of the resultant extraction liquid was measured by ion chromatography (using DX-320 available from Nippon Dionex K.K.). Table 2 shows the results.

(6) Evaluation of Package Reliability (HAST Resistance) in High-Temperature and Humidity Environment After the laminated semiconductor device obtained in (3) described above was mounted on a secondary substrate for extracting electrodes, the laminated semiconductor device was processed at 60° C. and 60% RH for 120 hours as pretreatment. Subsequently, an electric current was continuously applied to the laminated semiconductor device with an applied voltage of 3.5 V at 130° C. and 85% RH for 220 hours.

When the insulation resistance between electrodes was lower than $1 \times 10^7 \Omega$, the evaluation was determined to be poor. The evaluation was performed on 20 semiconductor devices in each of Examples and Comparative Examples and the number of poor devices (NG number) was counted. Table 2 shows the results.

TABLE 2

|  | Chloride ion concentration (ppm) | Reaction rate (%) | Evaluation for HAST resistance (NG number/total number) |
| --- | --- | --- | --- |
| Example 1 | 0.665 | >99 | 0/20 |
| Example 2 | 0.613 | >99 | 0/20 |
| Example 3 | 0.613 | >99 | 0/20 |
| Example 4 | 0.651 | >99 | 0/20 |
| Example 5 | 0.672 | >99 | 0/20 |
| Comparative Example 1 | 2.610 | >99 | 19/20 |
| Comparative Example 2 | 0.620 | 93 | 1/20 |
| Comparative Example 3 | 2.550 | >99 | 20/20 |

INDUSTRIAL APPLICABILITY

According to the present invention, since a cured adhesive composition constituting an adhesive layer contains a small amount of ion impurities, there can be provided a semiconductor chip laminate that can exhibit good package reliability (HAST resistance) even under high-temperature and humidity conditions.

There can be provided an adhesive composition for semiconductor chip lamination that can impart such characteristics to the semiconductor chip laminate and can exhibit high efficiency of a thermal curing reaction when being thermally cured because it contains an organophosphonium compound as a thermal curing accelerator.

What is claimed is:

1. A semiconductor chip laminate comprising:
   a plurality of semiconductor chips; and
   an adhesive layer through which the plurality of semiconductor chips are laminated,
   wherein the adhesive layer is composed of an adhesive composition comprising: an acrylic polymer (A); an epoxy resin (B); a thermal curing agent (C); and, an organophosphonium compound (D) selected from the group consisting of tetraphenylphosphonium tetraphenylborate, tetraphenylphosphonium tetramethylphenylborate, tetrabutylphosphonium decanoate, and tetraphenylphosphonium thiocyanate, as a thermal curing accelerator, and the content of the organophosphonium compound (D) relative to 100 parts by weight in total of the epoxy resin (B) and the thermal curing agent (C) is 0.5 to 8 parts by weight.

2. The semiconductor chip laminate according to claim 1, wherein the organophosphonium compound (D) is selected from the group consisting of tetrabutylphosphonium decanoate and tetraphenylphosphonium thiocyanate.

* * * * *